(12) United States Patent
Schmidt

(10) Patent No.: US 9,312,338 B2
(45) Date of Patent: Apr. 12, 2016

(54) SEMICONDUCTOR DEVICE CONTAINING CHALCOGEN ATOMS AND METHOD OF MANUFACTURING

(71) Applicant: Infineon Technologies AG, Neubiberg (DE)

(72) Inventor: Gerhard Schmidt, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/318,921

(22) Filed: Jun. 30, 2014

(65) Prior Publication Data

US 2015/0380492 A1    Dec. 31, 2015

(51) Int. Cl.
| | |
|---|---|
| H01L 29/00 | (2006.01) |
| H01L 29/167 | (2006.01) |
| H01L 21/265 | (2006.01) |
| H01L 29/10 | (2006.01) |
| H01L 21/324 | (2006.01) |
| H01L 21/225 | (2006.01) |

(52) U.S. Cl.
CPC .......... *H01L 29/167* (2013.01); *H01L 21/2253* (2013.01); *H01L 21/26513* (2013.01); *H01L 21/324* (2013.01); *H01L 29/1095* (2013.01)

(58) Field of Classification Search
CPC .............. H01L 29/0834; H01L 29/167; H01L 29/7395; H01L 29/36; H01L 29/32
See application file for complete search history.

(56) References Cited

U.S. PATENT DOCUMENTS

| | | | |
|---|---|---|---|
| 8,361,893 B2 | 1/2013 | Schmidt et al. | |
| 2008/0054369 A1* | 3/2008 | Schulze et al. | 257/378 |
| 2010/0078774 A1* | 4/2010 | Hirler | 257/652 |

OTHER PUBLICATIONS

Bothe, et al., "Electronically Activated Boron-Oxygen-Related Recombination Centers in Crystalline Silicon", Journal of Applied Physics, 2006 American Institute of Physics, vol. 99, Jan. 3, 2006, pp. 1-11.
Falck, et al., "Semiconductor Device Including Undulated Profile of Net Doping in a Drift Zone", U.S. Appl. No. 14/165,658, filed Jan. 28, 2014, pp. 1-29.

\* cited by examiner

*Primary Examiner* — Victor A Mandala
*Assistant Examiner* — Quovaunda V Jefferson
(74) *Attorney, Agent, or Firm* — Murphy, Bilak & Homiller, PLLC

(57) ABSTRACT

A semiconductor device includes a single crystalline semiconductor body with a first surface and a second surface parallel to the first surface. The semiconductor body contains chalcogen atoms and a background doping of pnictogen and/or hydrogen atoms. A concentration of the chalcogen atoms is at least $1E12$ cm$^{-3}$. A ratio of the chalcogen atoms to the atoms of the background doping is in a range from 1:9 to 9:1.

18 Claims, 7 Drawing Sheets

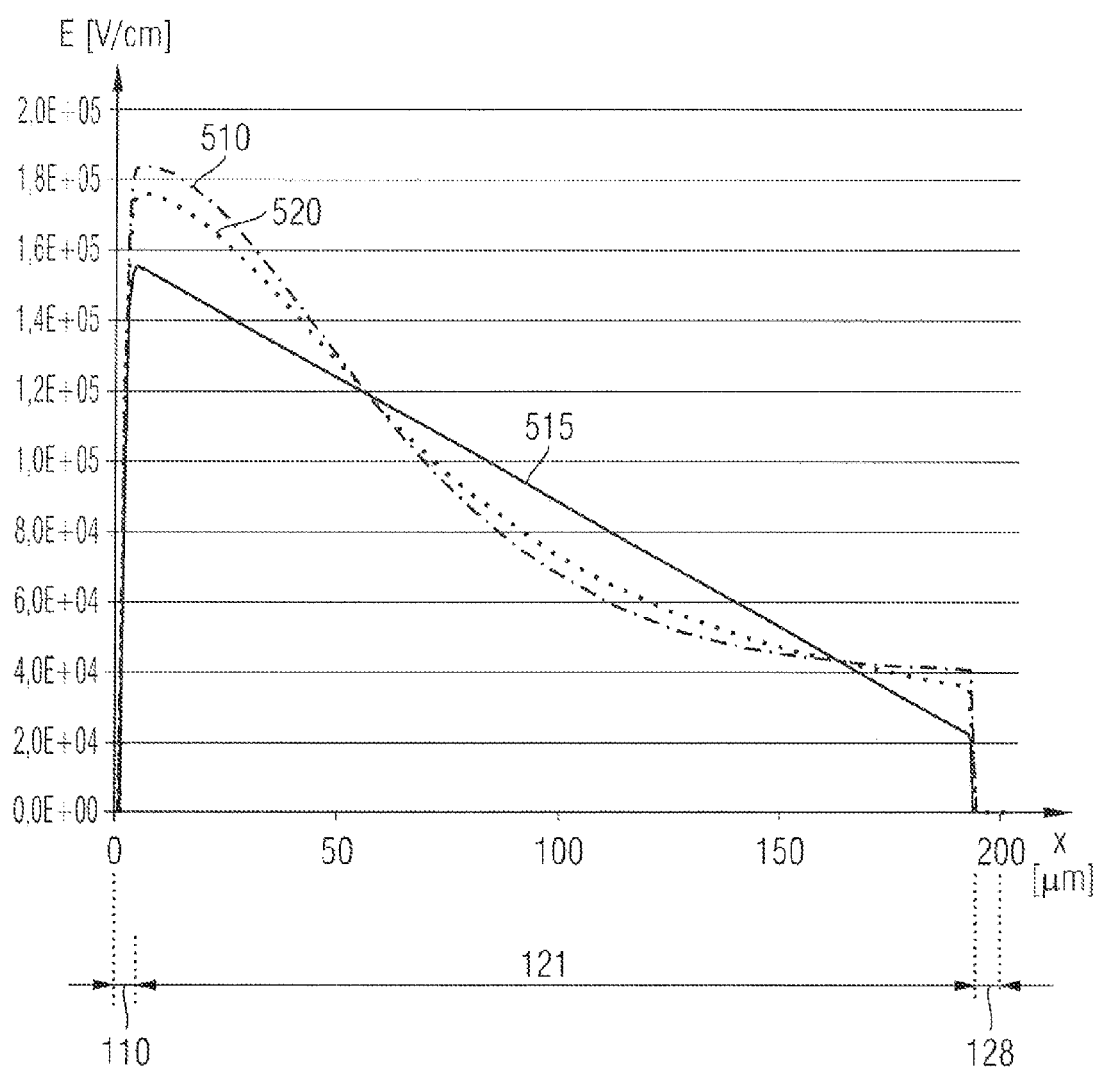

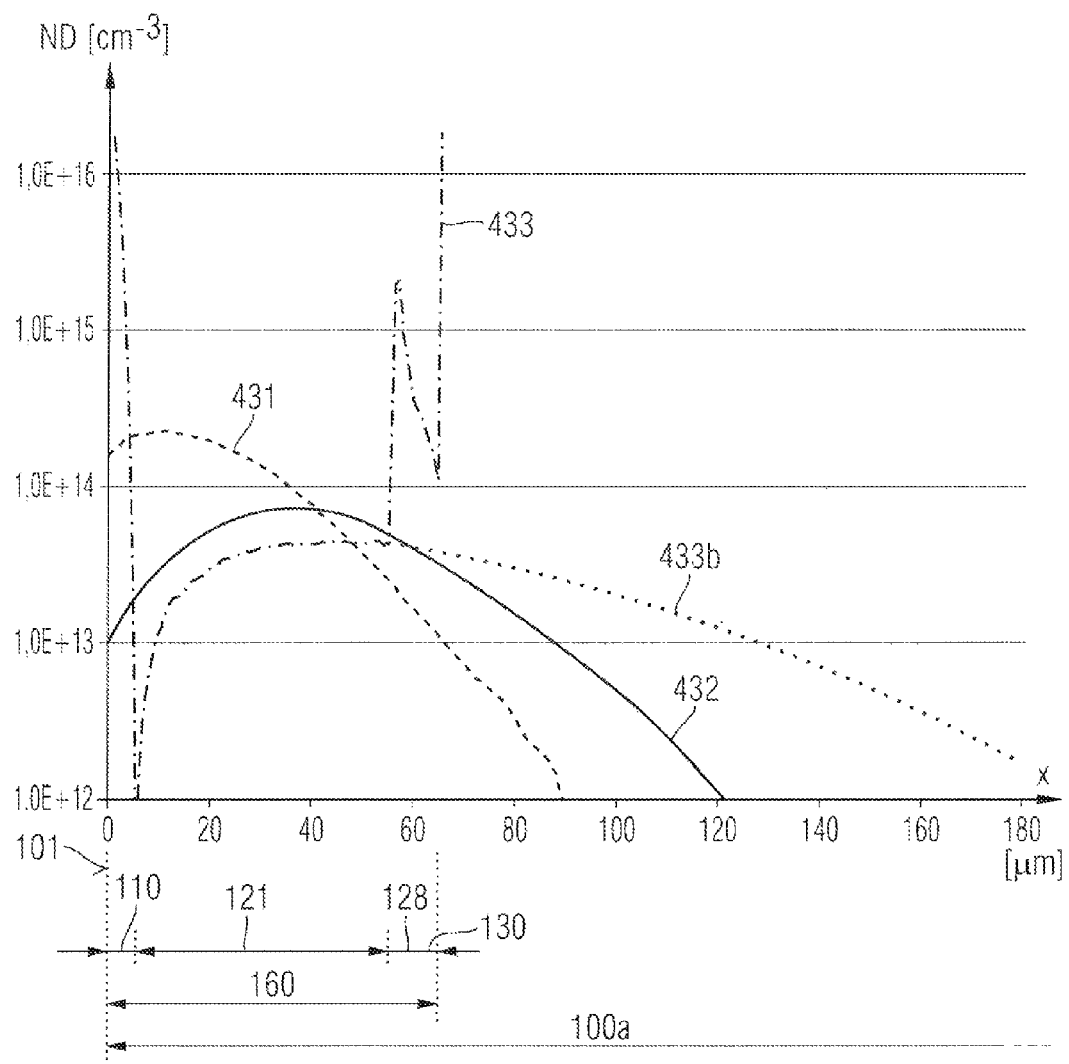

US 9,312,338 B2

SEMICONDUCTOR DEVICE CONTAINING CHALCOGEN ATOMS AND METHOD OF MANUFACTURING

BACKGROUND

Typically, semiconductor wafers for the production of power semiconductor devices such as power semiconductor diodes and IGBTs (insulated gate bipolar transistors) are obtained from silicon ingots grown in a floating zone process (Fz wafers). Semiconductor wafers obtained from silicon rods drawn from molten raw material in a crucible in a Czochralski process (Cz wafers) are less expensive and may have greater diameters. Segregation effects during the pulling process, however, result in significant axial variations of the dopant concentration along the longitudinal axis of the rod. In addition, radial fluctuations (striations) of doping substances result in significant radial variations of the specific resistance in the Cz wafers obtained from the rod. The comparatively high variations of the initial background doping complicate the manufacture of semiconductor devices, e.g. power semiconductor devices, from such semiconductor wafers. It is desirable to manufacture semiconductor devices in a more cost effective manner.

SUMMARY

According to an embodiment a semiconductor device includes a single crystalline semiconductor body with a first surface and a second surface parallel to the first surface. The semiconductor body contains chalcogen atoms and a background doping of pnictogen atoms. A concentration of the chalcogen atoms is at least $5E12$ $cm^{-3}$. A ratio of the chalcogen atoms to the pnictogen atoms of the background doping is in a range from 1:9 to 9:1.

According to a method of manufacturing a semiconductor device chalcogen atoms are implanted into a single crystalline semiconductor substrate that contains pnictogen atoms. The concentration of the chalcogen atoms is at least $1E12$ $cm^{-3}$. A total ratio of the chalcogen atoms to pnictogen atoms is in a range from 1:9 to 9:1.

According to a further embodiment a semiconductor device includes a single crystalline semiconductor body with a first surface and a second surface parallel to the first surface. The semiconductor body contains chalcogen atoms and a background doping of pnictogen and/or hydrogen atoms. A concentration of the chalcogen atoms is at least $5E12$ $cm^{-3}$. A ratio of the chalcogen atoms to the atoms of the background doping is in a range from 1:9 to 9:1.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic diagram showing electric field distributions in the semiconductor diode of FIG. 1A and in reference devices.

FIG. 2 is a schematic diagram showing vertical impurity profiles in a semiconductor substrate in course of manufacturing the semiconductor device of FIG. 1A for illustrating details of the chalcogen distribution.

DETAILED DESCRIPTION

Figure 1A:
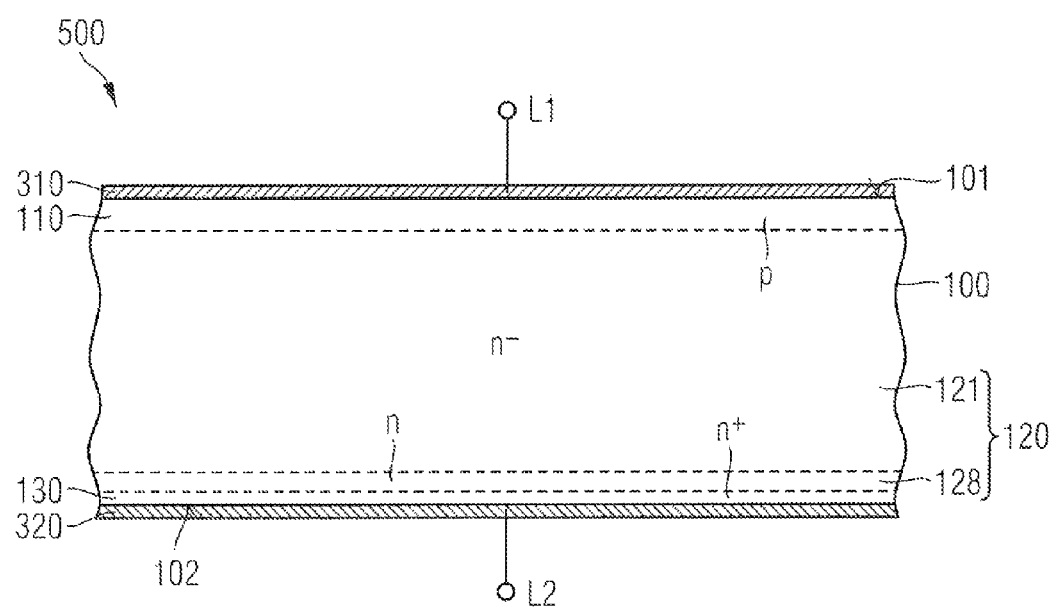
FIG. 1A is a schematic cross-sectional view of a portion of a semiconductor device containing chalcogen atoms and an approximately uniform background doping of pnictogen atoms according to an embodiment related to semiconductor diodes.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

Semiconductor devices according to the embodiments may be semiconductor diodes, IGFETs (insulated gate field effect transistors), IGBTs (insulated gate bipolar transistors), e.g., RC-IGBTs (reverse conducting IGBTs), BJTs (bipolar junction transistors), thyristors, GTOs (gate turn-off thyristors) or radiation detectors.

The semiconductor device 500 in FIG. 1A is a semiconductor diode, for example a power semiconductor diode with a nominal forward current $I_F$ greater 100 mA, e.g. greater 1 A or greater 10 A.

A single-crystalline semiconductor material, for example silicon (Si), silicon carbide (SiC), germanium (Ge), a silicon germanium crystal (SiGe), gallium nitride (GaN), gallium arsenide (GaAs) or another $A_{III}B_V$ semiconductor forms a semiconductor body 100 with a first surface 101, which may be approximately planar or which may be defined by a plane spanned by coplanar surface sections, at a front side as well as a planar second surface 102 parallel to the first surface 101 at a rear side opposite to the front side.

A minimum distance between the first and second surfaces 101, 102 depends on the voltage blocking capability the semiconductor device 500 is specified for. For example, the distance between the first and second surfaces 101, 102 may be in a range from 90 μm to 200 μm when the semiconductor device 500 is specified for a blocking voltage of about 1200 V. Other embodiments related to semiconductor devices with higher blocking capabilities may provide semiconductor bodies 100 with a thickness of several 100 μm. Semiconductor devices with lower blocking capabilities may have a thickness from 35 μm to 90 μm.

In a plane parallel to the first surface 101 the semiconductor body 100 may have a rectangular shape with an edge length in the range of several millimeters. Directions parallel to the first surface 101 are horizontal directions and directions perpendicular to the first surface 101 are vertical directions. A distance between the first and second distances is at least 30 μm, e.g. at least 100 μm, or at least 120 μm.

The semiconductor body 100 includes a first load contact layer 110 forming an ohmic contact with a first load electrode 310 at the front side as well as a second load contact layer 130 forming an ohmic contact with a second load electrode 320 at the rear side. The first load electrode 310 forms or is electrically connected to a first load terminal L1. The second load electrode 320 forms or is electrically connected to a second load terminal L2. The first and second load contact zones 110, 130 have opposite conductivity types. According to the illustrated embodiment, the first load contact layer 110 is p conductive and the second load contact layer 130 is n conductive.

The semiconductor device 500 further includes a base region 120 of the conductivity type of the second load contact region 130. The base region 120 may include a weakly doped drift zone 121 with an effective dopant concentration of at least 1E13 cm$^{-3}$ and at most 1E17 cm$^{-3}$. The doping of the drift zone 121 may correspond to an initial total background doping of the semiconductor body 100. The drift zone 121 and the first load contact layer 110 may form a pn junction. The base region 120 may further include a field stop layer 128 sandwiched between the drift zone 121 and the second load contact layer 130, wherein a mean impurity concentration in the field stop layer 128 is at least twice, e.g., ten times as high as the effective dopant concentration in the drift zone 121.

According to other embodiments, the base region 120 may further include a compensation structure such as a superjunction structure for increasing the voltage blocking capabilities at comparatively high dopant concentrations in the drift zone 121, barrier layers for increasing the plasma density at a side of the base region 120 oriented to the front side, floating counter-doped zones and/or further doped layers.

The semiconductor body 100 includes chalcogen atoms, i.e., atoms of chemical elements in group 16 ("oxygen family") of the periodic table such as sulfur (S), selenium (Se) and tellurium (Te).

A mean chalcogen concentration in the semiconductor body may be between 1E12 cm$^{-3}$ and 1E16 cm$^{-3}$, e.g., in a range from 1E13 cm$^{-3}$ to 1E14 cm$^{-3}$. According to an embodiment the chalcogen atoms are selenium atoms, wherein at least 1 percent, for example 3, 5, or 10 percent of the selenium atoms are electrically active on substitutional lattice sites and act as double donors in the operational mode of the semiconductor device 500.

The semiconductor body 100 further includes an approximately uniform background doping of pnictogen atoms, i.e., atoms of chemical elements in group 15 ("nitrogen family", former group V) of the periodic table such as phosphorus (P), arsenic (As) and antimony (Sb). The pnictogen atoms are in substance uniformly distributed in the whole semiconductor body 100, wherein a concentration of the uniform background doping deviates by not more than 8%, e.g., by not more than 5% from a mean value and wherein the semiconductor body 100 is obtained from wafers specified with an inter wafer deviation of the uniform background doping of at most 15%.

A total ratio of chalcogen atoms to pnictogen atoms of the in substance uniform background doping is in a range from 1:9 to 9:1. In other words, a chalcogen portion of the initial total background doping is in a range from about 10 At % to about 90 At %. The chalcogen atoms and the uniform pnictogen background doping define the initial total background doping.

The total chalcogen content results from an implant with a deviation from a target implant dose of at most ±5%, wherein the chalcogen atoms are implanted through the first surface 101 at the front side of the semiconductor body 100 and a chalcogen concentration gradually decreases with increasing distance to the first surface 101. At the available thermal budget typically applied in the course of the manufacturing process for semiconductor devices, the doping gradient of the chalcogen concentration significantly drops at a distance to the first surface 101 greater than 60 μm.

By contrast, the pnictogen atoms of the uniform background doping are incorporated during crystal growth of the origin semiconductor ingot. Instead of a concentration drop along the vertical direction, the uniform background doping may rather significantly deviate from a target value. Typically, in Cz wafers a maximum deviation of the phosphorus content from a mean value or target value is ±15%.

The semiconductor body 100 may include further doped zones containing dopants, e.g., pnictogen atoms in addition to the uniform pnictogen background doping. For example, in addition to the chalcogen dopants and the uniform pnictogen background doping, the field stop layer 128 may contain a first main dopant, for example hydrogen atoms, implanted from the rear side through the second surface 102 at a first main dopant concentration between 1E14 and 1E18 cm$^{-3}$. The second load contact layer 130 may contain a second main dopant, for example phosphorus atoms. The second main dopant concentration ensures an ohmic contact with the second load electrode 320 and may be at least 1E18, or at least 5E19 cm$^{-3}$, by way of example.

The co-doping of chalcogen and pnictogen atoms for the total background doping uses the tighter specification for the chalcogen implant to obtain semiconductor bodies with tightly defined total background doping dose. The co-implant further uses the more uniform background pnictogen distribution for tailoring the total vertical dopant gradient closer to that of semiconductor bodies obtained from Fz wafers. In the finalized semiconductor device 500, the drift zone 121 may contain no more than the initial total background doping defined by the chalcogen atoms and the original approximately uniform pnictogen background doping.

The pnictogen background doping may be selected according to the tolerance specified for the specific electric resistance of a mean base doping of the concerned semiconductor device.

For example, the implant process for selenium atoms is specified with a maximum deviation of at least ±5% and the maximum deviation of a specific resistance (ρ value) of a Cz wafer having a uniform phosphorus background doping is ±15%. A target specification of a semiconductor device with a semiconductor body having a vertical extension (thickness) of 200 μm may define that the specific electrical resistance is 93 Ωcm at a target tolerance or maximum total deviation of ±8%. From the target tolerance results a selenium content of at least 53.9 At % of the dopants of the total background doping. The remaining phosphorus content corresponds, for the given thickness of 200 μm, to a ρ value of 350 Ωcm for the original Cz wafer. In other words, the semiconductor body contains a selenium dose of about 3.4E11 cm$^{-2}$ and a phosphorus dose of about 2.5E11 cm$^{-2}$. At a selenium content of 18 At %, the maximum total deviation or the achievable target tolerance is at most 12%.

According to other embodiments, the semiconductor body 100 includes hydrogen atoms partially or completely substituting the pnictogen atoms of the uniform background doping.

Figure 1B:
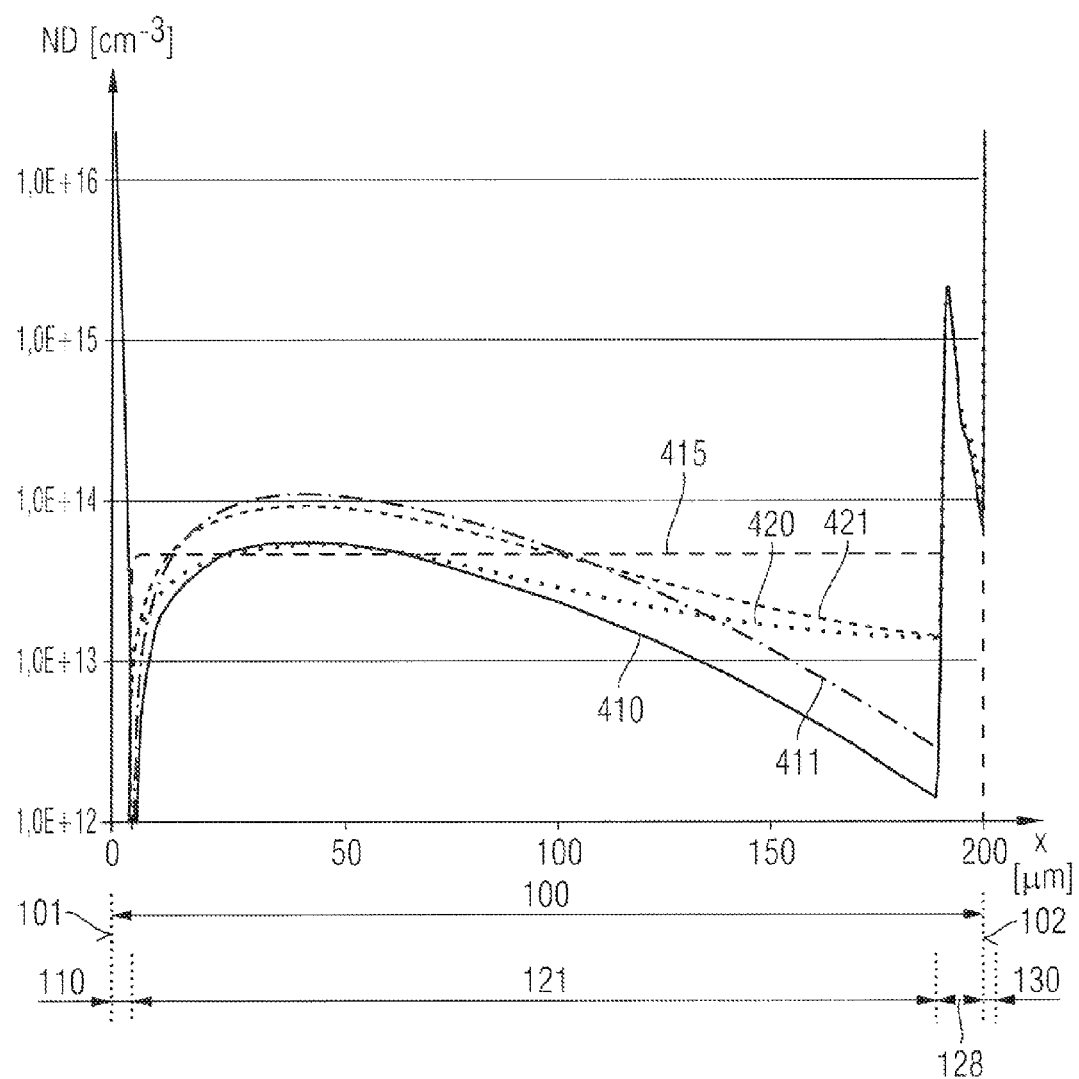
FIG. 1B is a schematic diagram showing vertical dopant profiles in the semiconductor device of FIG. 1A.

FIG. 1B shows vertical doping profiles for the semiconductor device 500 of FIG. 1A, wherein the doping concentrations in the drift zone 121 correspond to the total background dopant concentration in the whole semiconductor body 100 before implanting the first load contact layer 110, which is effective as anode layer, the field stop region 128 and the second load contact layer 130, which is effective as cathode layer.

The uniform distribution 415 corresponds to a first reference device with a uniform phosphorus background concentration and a ρ value of 93 Ωcm.

The selenium concentration 410 refers to a second reference device without pnictogen background doping of the silicon ingot. The selenium atoms are implanted from the front side. Then the semiconductor body 100 is heated and the selenium atoms diffuse into the direction of the second surface 102, wherein auxiliary impurities, e.g., phosphorus atoms may promote the diffusion of the selenium atoms by generating silicon self-interstitials. With increasing thermal budget, the selenium concentration 410 flattens. The thermal budget typically applied for the semiconductor device 500 results in a significant drop of the selenium concentration at and beyond a distance to the first surface 101 of about 60 μm. A significant thermal budget is required to flatten the selenium concentration 410 to a significant degree also beyond distances to the first surface 101 of more than 70 μm.

Effective donor profile 411 illustrates the concentration gradient of the donor charge resulting from the double ionization of the selenium atoms in the depletion zone of the second reference device.

Co-doping profile 420 corresponds to a total concentration of selenium and phosphorus atoms in the semiconductor device 500 of FIG. 1A. The selenium content of the total background doping is 54 At %. The phosphorus content of the total background corresponds to a ρ value of 350 Ωcm. Effective co-doping profile 421 corresponds to the effective donor concentration in the depletion zone considering the characteristic of selenium as double donor. The co-doping shifts a distance where the selenium concentration 410 significantly drops to values beyond 70 μm.

The total distance between the first load contact zone 110 and the field stop layer 128 corresponds to the reverse voltage blocking capabilities of the semiconductor device 500, wherein about 8 to 12 μm layer thickness may correspond to a voltage blocking capability of about 100V. The embodiments allow providing, from Cz wafers, semiconductor devices having similar dopant profiles as semiconductor devices obtained from Fz wafers even for blocking voltages beyond 1000 V. In addition fine tuning of the chalcogen dose may compensate for fluctuations of the ρ value of virgin Cz wafers and Fz wafers.

FIG. 1C shows electric field distribution for the first and second reference devices of FIG. 1B as well as the semiconductor device 500 of FIG. 1A. Field distribution 515 corresponds to that of the first reference device with a constant net doping profile in the drift zone 121 as it is typical for semiconductor devices resulting from Fz wafers. Field distribution 510 corresponds to the second reference device with the dopants in the drift zone 121 exclusively provided from selenium atoms. Field distribution 520 corresponds to the co-doping embodiment containing 54 At % selenium and 46 At % phosphorus atoms at complete ionization at a nominal blocking voltage of 1700 V.

With respect to the second reference device, the co-doping of phosphorus and selenium significantly decreases the electric field strength at the pn junction to the first load contact zone 110 as well as at the pn junction to the field stop layer 128. The deviation from the linear field distribution 515 is the smaller the thinner the semiconductor device is and the greater the admissible deviation for the ρ value is. The remaining curvature of the selenium concentration with the concentration maximum in a central zone of the drift zone 121 tends to decrease the switching losses and numerical simulations indicate that switching softness can be significantly improved.

FIG. 2 illustrates doping profiles in the course of manufacturing a semiconductor device, for example a semiconductor diode with a blocking voltage of about 600 V.

Selenium atoms are implanted through a first surface 101 of a semiconductor substrate 100a at a dose in the range from 1E13 cm$^{-2}$ to 1E15 cm$^{-2}$ at an implant energy in a range from 15 keV to 500 keV. An auxiliary layer effective as a source for auxiliary impurities may be formed on the first surface 101. The auxiliary layer may be a phosphoric glass formed in an atmosphere containing PH$_3$ (phosphane) or POCl$_3$ (phosphoryl chloride). During a first heating treatment, the implanted selenium atoms diffuse out from the implanted layer, wherein the auxiliary impurities of the auxiliary layer displace to some degree atoms of the crystal lattice of the semiconductor and thereby generate semiconductor interstitials in the semiconductor crystal of the semiconductor substrate 100a. The self-interstitials promote the diffusion of the implanted selenium atoms by kicking them out and ousting them from their lattice points. The auxiliary layer is removed. First selenium doping profile 431 illustrates the selenium distribution in the semiconductor substrate 100a after removal of the auxiliary layer and after the first heating treatment that lasts at least 20 minutes at a temperature greater than 900° C. and lower than 1100° C.

Further high temperature processes applied in the course of manufacturing the semiconductor device, for example the formation of thermal oxides, flatten the selenium concentration profile as indicated with the second selenium doping profile 432. Further thermal treatments may further flatten the selenium concentration profile as indicated with the third selenium doping profile 433. After thinning, from the rear side, the semiconductor substrate 100a to a thickness of about 60 to 80 μm of semiconductor bodies 100 of semiconductor devices with blocking voltages up to 800 V, the resulting drift zone 121 exhibits an approximately uniform selenium concentration. Dopant profile 433 illustrates the total doping profile of a semiconductor diode with a p conductive first load contact layer 110, the n conductive drift zone 121, an n conductive field stop layer 128 resulting from a proton implant and an n conductive second load contact layer 130 resulting from a phosphorus implant through the rear side surface of the thinned semiconductor substrate 100a.

For achieving uniformly doped drift zones for blocking voltages beyond 1200 V, a significantly higher thermal budget must be applied that typically increases slip line density and production costs. The present embodiments achieve a similar effect at significantly reduced effort.

Figure 3A:
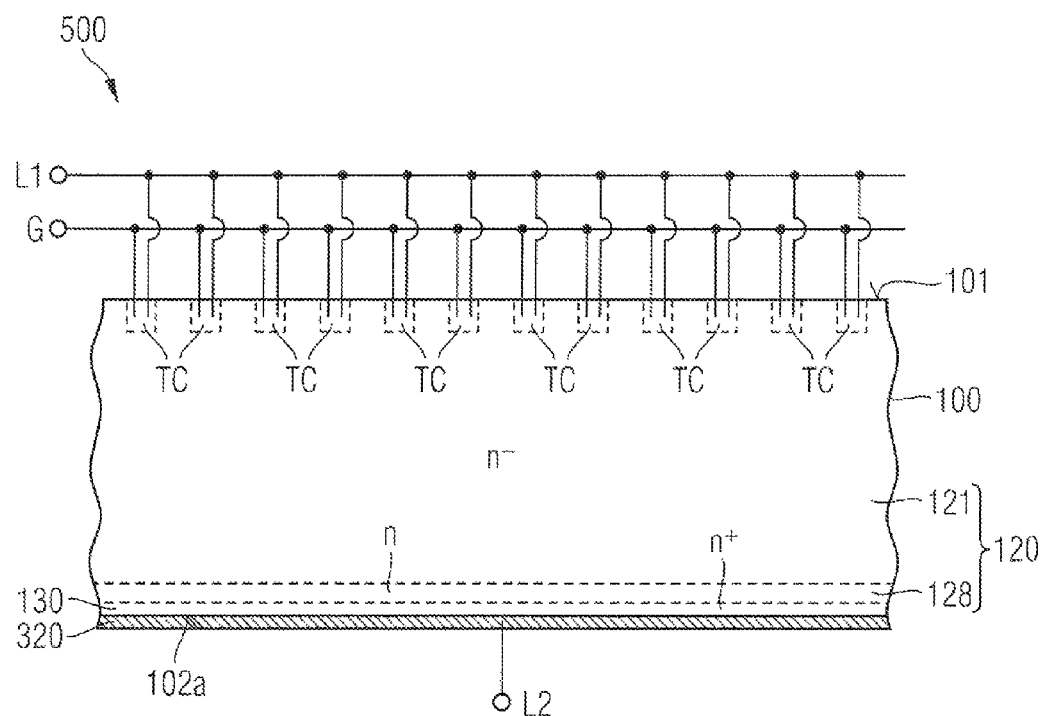
FIG. 3A is a schematic cross-sectional view of a portion of a semiconductor device containing chalcogen atoms and an approximately uniform background doping of pnictogen atoms according to an embodiment related to IGBTs.

FIG. 3A refers to a semiconductor device 500 such as an IGFET, an IGBT, for example an RC-IGBT, a BJT, a thyristor, or a GTO. As regards general features of the semiconductor body 100, reference is made to the description of the semiconductor device 500 of FIGS. 1A to 1C. The second load contact layer 130 sandwiched between the base region 120 and the second load electrode 320 may be an n conductive layer for IGFETs, a p conductive layer in case of non-reverse conducting IGBTs or a layer containing both n conductive and p conductive zones in case the semiconductor device 500 is an RC-IGBT.

In lieu of the first load contact layer 110 of FIG. 1A, the semiconductor device 500 includes transistor cells TC which may be IGFET cells with n conductive source zones and p conductive body zones separating the source zones from the drift zone 121, respectively. The source zones may be electrically connected or coupled to the first load electrode which may be provided on the front side and/or to the first load terminal L1 of the semiconductor device 500.

Gate electrodes of the transistor cells TC may be electrically connected or coupled to a gate terminal G and are capacitively coupled to the body zones through gate dielectrics. Subject to a voltage applied to the gate terminal G, inversion channels are formed in the body zones and provide an electron current through the transistor cells TC such that electrons enter the drift zone 121 through the transistor cells TC in a first state of the semiconductor device 500, which may correspond to a transistor mode of an IGBT or a conductive mode of an IGFET.

In addition to the source zones, the body zones are electrically connected or coupled to the first load terminal L1, wherein the body zones may inject holes into the drift zone 121 in a second state of the semiconductor device 500, wherein the second state may correspond to a reverse conducting mode of an RC-IGBT, by way of example.

The transistor cells TC may be planar gate cells with planar gate structures arranged outside a contour of the semiconductor body 100 or trench gate cells with trench gate structures extending into the semiconductor body 100. For example, the source and body zones of the transistor cells TC may be formed in semiconductor mesas separated by trench gate structures. The dopant content in the drift zone 121 may correspond to a total background doping including uniformly distributed pnictogen atoms as well as chalcogen atoms with a slightly curved or sloping doping profile as described in the previous figures.

Figure 3B:
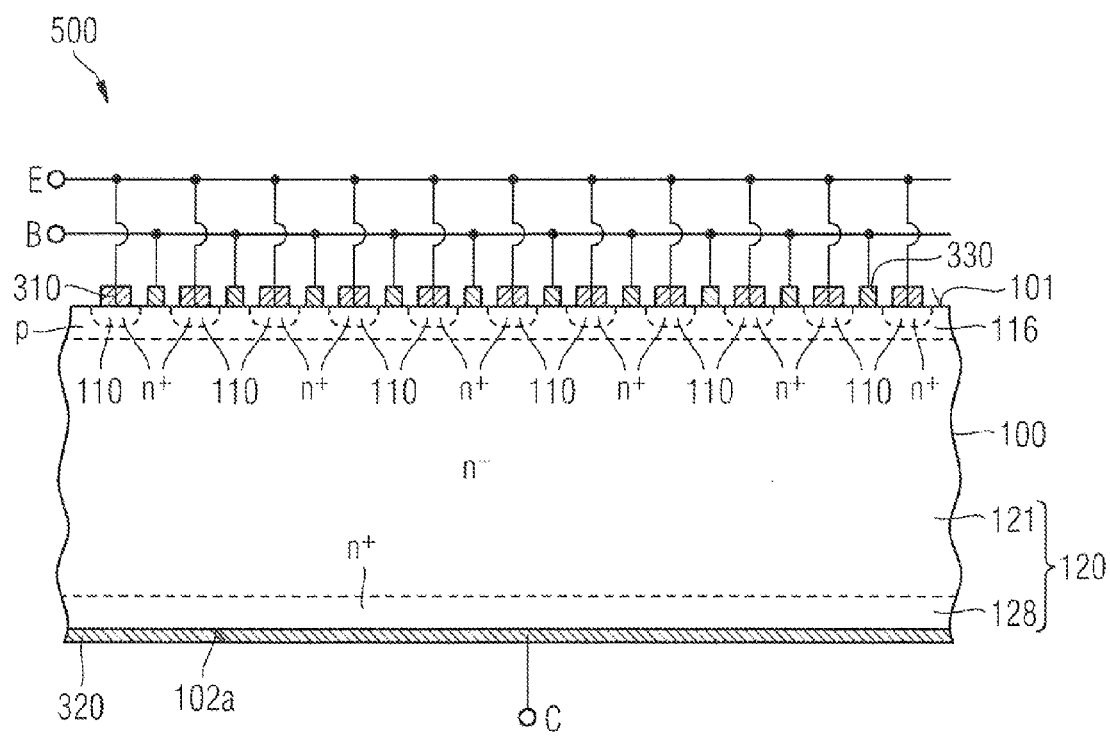
FIG. 3B is a schematic cross-sectional view of a portion of a semiconductor device containing chalcogen atoms and an approximately uniform background doping of pnictogen atoms according to an embodiment related to bipolar transistors.

In FIG. 3B the semiconductor device 500 is a BJT including a p-doped base layer 116 forming a pn junction with the drift zone 121. Emitter zones 110 form further pn junctions with the base layer 116. A base connection structure 330 forms ohmic contacts with the base layers 116 and is electrically connected or coupled to a gate terminal G. A first load electrode 310 forms ohmic contacts with the emitter zones 110 and is electrically connected to an emitter terminal E. A second load electrode 320 forms an ohmic contact with the second load contact layer 130, which is effective as collector zone, and is electrically connected to a collector terminal C of the semiconductor device 500.

Figure 4:
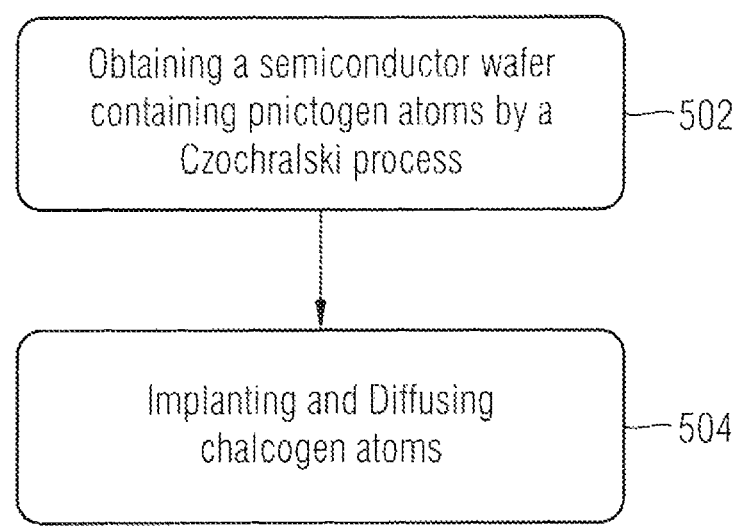
FIG. 4 is a schematic flowchart for illustrating a method of manufacturing a semiconductor device according to a further embodiment.

FIG. 4 refers to a method of manufacturing a semiconductor device. A semiconductor wafer is obtained in a Czochralski process, wherein the semiconductor wafer contains a pnictogen background doping of at least 1E13 cm$^{-3}$ (502). Chalcogen atoms are implanted into the semiconductor wafer (504), wherein the ratio of chalcogen atoms to the pnictogen atoms of the pnictogen background doping is in a range from 1:9 to 9:1.

Auxiliary impurities may be provided for increasing a density of interstitial semiconductor atoms. The semiconductor wafer is heated such that the chalcogen atoms diffuse deeper into the semiconductor substrate, wherein the auxiliary impurities support the diffusion by increasing the density of interstitial atoms in the semiconductor substrate. An auxiliary layer containing and supplying the auxiliary impurities may be formed before the heating treatment and may be removed after the heating treatment. The auxiliary impurities may be phosphorus atoms. The semiconductor wafer may be a single crystalline silicon wafer. The implanted chalcogen may be selenium.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a single-crystalline semiconductor body with a first surface and a second surface parallel to the first surface, the semiconductor body containing chalcogen atoms and a background doping of pnictogen atoms, wherein a concentration of the chalcogen atoms is at least 1E12 cm$^{-3}$ and a ratio of the chalcogen atoms to the pnictogen atoms of the background doping is in a range from 1:9 to 9:1 and
    wherein the semiconductor body comprises a drift zone extending parallel to the first surface and spaced from both the first and second surface, wherein an effective dopant concentration in the drift zone is defined by the chalcogen atoms and the background doping of pnictogen atoms in the semiconductor body.

2. The semiconductor device of claim 1, wherein The semiconductor body has a vertical extension of at least 50µm perpendicular to the first surface.

3. The semiconductor device of claim 1, wherein the ratio of chalcogen atoms to pnictogen atoms is in a range from 5:5 to 6:4.

4. The semiconductor device of claim 1, wherein the electric active chalcogen concentration is greater than $1E12\,cm^{-2}$.

5. The semiconductor device of claim 1, wherein the chalcogen is selenium.

6. The semiconductor device of claim 1, wherein the pnictogen is phosphorus.

7. The semiconductor device of claim 1, wherein the semiconductor substrate is a silicon crystal.

8. The semiconductor device of claim 1, further comprising:
a field stop layer between the drift zone and the second surface, the field stop layer further containing a first main dopant at a first main dopant concentration that is at least twice as high as the effective dopant concentration in the drift zone.

9. The semiconductor device of claim 1, further comprising:
a load contact layer directly adjoining the second surface, the load contact layer further containing a second main dopant and forming an ohmic contact with a metal-containing load electrode directly adjoining the load contact layer.

10. The semiconductor device of claim 1, wherein the background doping of pnictogen atoms varies by not more than 5%.

11. The semiconductor device of claim 1, wherein
a distance between the first and second surfaces is at least 120 µm.

12. A method of manufacturing a semiconductor device, the method comprising:
implanting, from a front side, chalcogen atoms into a single crystalline semiconductor wafer containing uniformly distributed pnictogen atoms, wherein in the semiconductor wafer a ratio of the chalcogen atoms to the pnictogen atoms is in a range from 1:9 to 9:1.

13. The method of claim 12, further comprising:
providing a source for auxiliary impurities at the front side of the semiconductor wafer for increasing a density of interstitial semiconductor atoms before heating the semiconductor wafer up to at least 900 degree Celsius a first time after implanting the chalcogen atoms.

14. The method of claim 13, wherein the auxiliary impurities are phosphorus atoms.

15. The method of claim 14, further comprising:
removing an auxiliary layer effective as the source for the auxiliary impurities after heating the semiconductor wafer up to at least 900 degree Celsius the first time.

16. The method of claim 12, wherein
the semiconductor wafer is obtained from a single crystalline silicon ingot formed by a Czochralski process from a raw material containing the pnictogen atoms.

17. The method of claim 12, wherein the chalcogen is selenium.

18. A semiconductor device, comprising:
a single-crystalline semiconductor body with a first surface and a second surface parallel to the first surface, the semiconductor body containing chalcogen atoms and a background doping of pnictogen and/or hydrogen atoms, wherein a concentration of the chalcogen atoms is at least $1E12\,cm^{-3}$ and a ratio of the chalcogen atoms to the atoms of the background doping is in a range from 1:9 to 9:1, and
wherein the semiconductor body comprises a drift zone extending parallel to the first surface and spaced from both the first and second surface, wherein an effective dopant concentration in the drift zone is defined by the chalcogen atoms and the background doping of pnictogen atoms in the semiconductor body.

* * * * *

UNITED STATES PATENT AND TRADEMARK OFFICE
CERTIFICATE OF CORRECTION

| | |
|---|---|
| PATENT NO. | : 9,312,338 B2 |
| APPLICATION NO. | : 14/318921 |
| DATED | : April 12, 2016 |
| INVENTOR(S) | : G. Schmidt |

It is certified that error appears in the above-identified patent and that said Letters Patent is hereby corrected as shown below:

Claims

Column 8, line 63 (claim 1, line 9) please change "9:1 and" to -- 9:1, and --
Column 9, line 3 (claim 2, line 1) please change "wherein The" to -- wherein the --

Signed and Sealed this
Second Day of August, 2016

Michelle K. Lee
*Director of the United States Patent and Trademark Office*